United States Patent
D'Amico et al.

(10) Patent No.: US 10,044,259 B2
(45) Date of Patent: Aug. 7, 2018

(54) LOW POWER DC-DC CONVERTER

(71) Applicant: Dialog Semiconductor (UK) Limited, London (GB)

(72) Inventors: Stefano D'Amico, Monteroni di Lecce (IT); Francesco Dalena, Leghorn (IT); Mirko Pasca, Neviano (IT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/357,033

(22) Filed: Nov. 21, 2016

(65) Prior Publication Data

US 2017/0070139 A1    Mar. 9, 2017

Related U.S. Application Data

(63) Continuation of application No. PCT/GB2015/051534, filed on May 27, 2015.

(30) Foreign Application Priority Data

May 27, 2014   (GB) .................... 1409392.6

(51) Int. Cl.
   *H02M 3/07*   (2006.01)
   *H03B 5/12*   (2006.01)

(52) U.S. Cl.
   CPC ............ *H02M 3/07* (2013.01); *H03B 5/1212* (2013.01); *H03B 5/1228* (2013.01); *H03B 2200/0082* (2013.01)

(58) Field of Classification Search
   CPC ............ H02M 3/00; H02M 3/04; H02M 3/06; H02M 3/07; H03B 2200/0082; H03B 5/08; H03B 5/12; H03B 5/1206; H03B 5/1209; H03B 5/1212; H03B 5/1215; H03B 5/1228
   USPC ........ 327/185, 227, 228, 229, 306, 536, 548
   See application file for complete search history.

(56) References Cited

U.S. PATENT DOCUMENTS

| | | | | |
|---|---|---|---|---|
| 6,122,185 A | * | 9/2000 | Utsunomiya | G04C 10/00 363/60 |
| 2003/0231072 A1 | * | 12/2003 | Mason | H03B 5/1228 331/117 R |
| 2006/0203407 A1 | * | 9/2006 | Katoh | H02M 3/07 361/93.1 |

(Continued)

FOREIGN PATENT DOCUMENTS

EP    2 017 946    1/2009

OTHER PUBLICATIONS

PCT Search Report, Application No. PCT/GB2015/051534, Applicant: Dialog Semocindoctor (UK) Limited, dated Nov. 5, 2015, 3 pgs.

(Continued)

*Primary Examiner* — William Hernandez
(74) *Attorney, Agent, or Firm* — Saile Ackerman LLC; Stephen B. Ackerman (57) ABSTRACT

A DC-DC converter comprises an oscillator and a charge pump, to ensure operation at low voltage. The oscillator comprises one or more source degenerated transistors comprising a degeneration impedance located between a source of the transistor and a ground connection. The degeneration impedance comprises an inductor and a capacitor. Also provided is an energy harvesting device comprising such a DC-DC converter.

20 Claims, 9 Drawing Sheets

(56) References Cited

U.S. PATENT DOCUMENTS

| | | | |
|---|---|---|---|
| 2007/0176705 A1* | 8/2007 | Sutardja | H01L 23/34 331/176 |
| 2010/0060231 A1 | 3/2010 | Trainor et al. | |
| 2011/0134665 A1* | 6/2011 | Ivanov | H02M 1/36 363/49 |
| 2011/0254514 A1 | 10/2011 | Fleming | |
| 2013/0162335 A1 | 6/2013 | Kim et al. | |
| 2014/0071722 A1* | 3/2014 | Gao | H02M 7/219 363/80 |
| 2014/0232189 A1* | 8/2014 | Gasparini | H02M 3/1584 307/31 |

OTHER PUBLICATIONS

PCT Written Opinion, Application No. PCT/GB2015/051534, Applicant: Dialog Semiconductor (UK) Limited, dated Nov. 5, 2015, 5 pgs.

"Integrated Capacitive Power-Management Circuit for Thermal Harvesters with Output Power 10 to 1000μW," by I. Doms et al., ISSCC 2009 / Session 17 / TD: Energy-Aware Sensor Systems / 17.8, 2009 IEEE International Solid-State Circuits Conference, Digest of Technical Papers, Feb. 8-12, 2009, 3 pgs.

"A 20mV Input Boost Converter With Efficient Digital Control for Thermoelectric Energy Harvesting," by Eric J. Carlson et al., IEEE Journal of Solid-State Circuits, vol. 45, No. 4, Apr. 2010, pp. 741-750.

"A 0.15 V Input Energy Harvesting Charge Pump With Dynamic Body Biasing and Adaptive Dead-Time for Efficiency Improvement," by Jungmoon Kim et al., IEEE Journal of Solid-State Circuits, vol. 50, No. 2, Feb. 2015, pp. 414-425.

"Multiple-Ghz Ring and LC VCOs in 0.18μm CMOS," by Yalcin Alper Eken et al., 2004 IEEE Radio Frequency Integrated Circuits Symposium, Digest of Papers, pp. 475-478. Jun. 6-8, 2004.

"Efficient Power Management Circuit: From Thermal Energy Harvesting to Above-IC Microbattery Energy Storage," by Helene Lhermet et al., IEEE Journal of Solid-State Circuits, vol. 43, No. 1, Jan. 2008, pp. 246-255.

"Enabling Self-Powered Autonomous Wireless Sensors with New-Generation I$^2$C-RFID Chips," by Danilo De Donno et al., IEEE MTT-S International Microwave Symposium Digest (IMS), Jun. 2013, pp. 1-4.

"Flexible Thermoelectric Generator for Wearable Biometric Sensors," by L. Francioso et al., IEEE Sensors 2010 Conference, Nov. 2010, pp. 747-750.

"Design Issues in CMOS Differential LC Oscillators," by Ali Hajimiri et al., IEEE Journal of Solid-State Circuits, vol. 34, No. 5, May 1999, pp. 717-724.

"A 0.5 V Sub-Microwatt CMOS Image Sensor With Pulse-Width Modulation Read-Out," by Scott Hanson et al., IEEE Journal of Solid-State Circuits, vol. 45, No. 4, Apr. 2010, pp. 759-767.

"Power Efficient Charge Pump in Deep Submicron Standard CMOS Technology," by Roberto Pelliconi et al., IEEE Journal of Solid-State Circuits, vol. 38, No. 6, Jun. 2003.

"A Battery-Less Thermoelectric Energy Harvesting Interface Circuit With 35 mV Startup Voltage," by Yogesh K. Ramadass et al., IEEE Journal of Solid-State Circuits, vol. 46, Nol. 1, Jan. 2011, pp. 333-341.

\* cited by examiner

LOW POWER DC-DC CONVERTER

This application is a Continuation of PCT Application no. PCT/GB2015/051534, which was filed on May 27, 2015. The PCT application claims priority to GB 1409392.6, which was filed on May 27, 2014.

TECHNICAL FIELD

The present disclosure relates to a low power DC-DC converter, and in particular to a boost converter.

BACKGROUND

Applications of the converter include, but are not limited to, stepping up a very low voltage from an energy harvesting device to a useful supply voltage.

An energy harvesting device is a device that generates electrical energy from an external or environmental source. Examples include radio frequency (RF) energy harvesters that collect radio frequency energy from ambient or dedicated sources, and a micro-thermoelectric generator that collects heat. A useful supply voltage is a voltage that is adequate to power a specific electronic circuit or device that is coupled (wired or wirelessly) with the energy harvesting device. The magnitude of the supply voltage that is useful will depend on the specific device in question.

One example application area is in the field of body sensor nodes (BSNs). These promise to provide significant benefits to the healthcare domain by enabling continuous monitoring, actuation, and logging of patient bio-signal data, which can help medical personnel to diagnose, prevent, and respond to various illnesses such as diabetes, asthma, and heart attacks. Though they show great potential, BSNs have many technical challenges that impede their widespread adoption including node operating lifetime, small form factor for wearability, and affordable cost. Conventional wireless sensors use batteries, limiting node lifetime and reducing user compliance due to the requirement for charging or replacing batteries.

Other forms of wearable technology promise significant benefits but are held back by similar technical challenges.

A DC-DC charge pump is required in order to step up an energy harvesting device's output voltage. However existing converters require mechanical start-up circuits or precharged batteries in order to start-up at very low voltages.

SUMMARY

According to the present disclosure there is provided a DC-DC converter comprising an oscillator with a charge pump wherein the oscillator comprises one or more source degenerated transistors comprising a degeneration impedance located between a source of the transistor and a ground connection, wherein the degeneration impedance comprises an inductor and a capacitor.

The source degeneration impedance may comprise an LC (inductor and capacitor) tank that helps in reducing the minimum supply voltage.

Optionally, the DC-DC converter is a boost converter.
Optionally, the oscillator is a low voltage oscillator.
A low voltage oscillator may have a supply voltage of around 1V or less.
Optionally, the oscillator is a differential oscillator.
Optionally, the charge pump comprises a plurality of charge pump stages.

According to another aspect of the disclosure there is provided an energy harvesting device comprising a DC-DC converter that includes an oscillator with a charge pump wherein the oscillator comprises one or more source degenerated transistors comprising a degeneration impedance located between a source of the transistor and a ground connection, wherein the degeneration impedance comprises an inductor and a capacitor.

Optionally, the DC-DC converter is a boost converter.
Optionally, the oscillator is a low voltage oscillator.
Optionally, the oscillator is a differential oscillator.
Optionally, the charge pump comprises a plurality of charge pump stages.

According to yet another aspect of the disclosure there is provided a method of DC-DC conversion comprising the step of: providing an oscillator with a charge pump wherein the oscillator comprises one or more source degenerated transistors comprising a degeneration impedance located between a source of the transistor and a ground connection, wherein the degeneration impedance comprises an inductor and a capacitor.

Optionally, the DC-DC converter is a boost converter.
Optionally, the oscillator is a low voltage oscillator.
Optionally, the oscillator is a differential oscillator.
Optionally, the charge pump comprises a plurality of charge pump stages.

According to yet another aspect of the disclosure there is provided a method of harvesting energy comprising the step of: providing a DC-DC converter that includes an oscillator with a charge pump wherein the oscillator comprises one or more source degenerated transistors comprising a degeneration impedance located between a source of the transistor and a ground connection, wherein the degeneration impedance comprises an inductor and a capacitor.

Optionally, the DC-DC converter is a boost converter.
Optionally, the oscillator is a low voltage oscillator.
Optionally, the oscillator is a differential oscillator.
Optionally, the charge pump comprises a plurality of charge pump stages. Further aspects of the disclosure may be derived from the detailed description that follows below.

BRIEF DESCRIPTION OF THE DRAWINGS

According to a further aspect of the disclosure there is provided a DC-DC converter substantially as herein described with reference to FIGS. 1-5; and with reference to FIGS. 6-13.

The disclosure will be described, by way of example only, with reference to the accompanying drawings, in which.

DESCRIPTION

Figure 1:
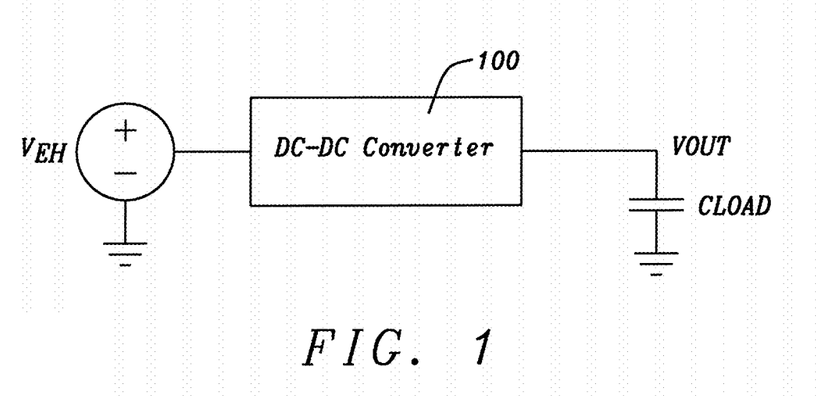
FIG. 1 shows a DC-DC converter according to an embodiment of the disclosure.

FIG. 1 illustrates the general concept of the disclosure. A voltage $V_{EH}$ from an energy harvesting device is input to a DC-DC converter 100 which provides an output voltage $V_{OUT}$ stored at an output capacitor $C_{LOAD}$ for powering a device.

The DC-DC converter 100 comprises an oscillator together with a charge pump. The oscillator is preferably a differential oscillator to provide a double output peak voltage. The oscillator (differential or otherwise) may also preferably be a low voltage oscillator. The charge pump may comprise a plurality of charge pump stages, which may be connected in series with the output of an earlier stage providing the input for a later stage. Each stage may operate to pump a unit of charge from its relatively lower voltage input to its relatively higher voltage output with each transition of a clock signal.

As an example, the DC-DC converter 100 may step up an input voltage of 80 mV to an output voltage of 400 to 1000 mV. The output impedance may be proportional to the number of charge pump stages.

Figure 2:
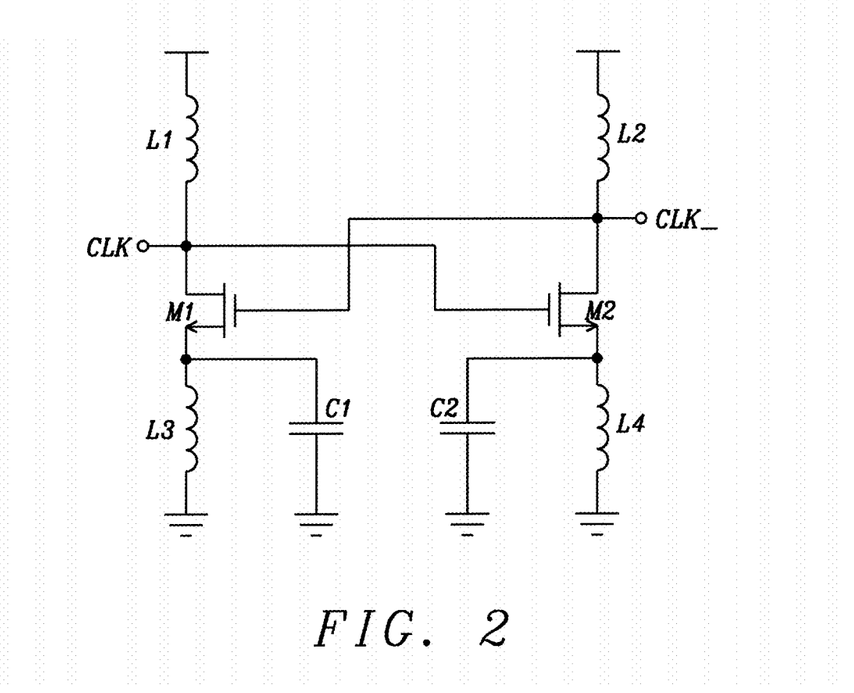
FIG. 2 shows a low voltage differential oscillator which may form part of the converter of FIG. 1.

FIG. 2 shows an example of a low voltage differential oscillator which may be used as part of the converter 100. It comprises a cross coupled NMOS transistors pair (M1, M2), with a degeneration impedance on the transistors' sources provided by an LC tank, and a resonant LC load on the transistors' drains.

Figure 3:
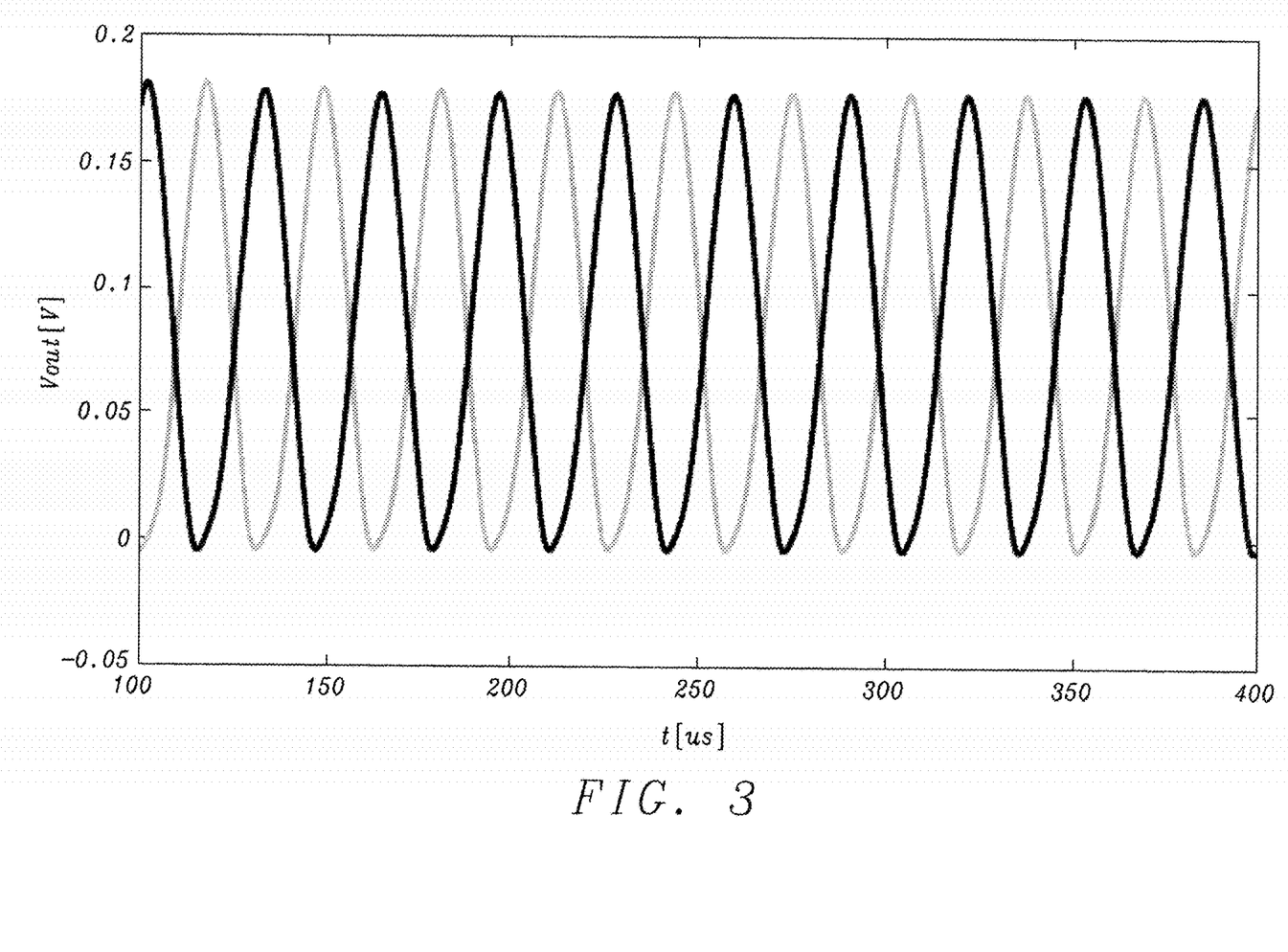
FIG. 3 shows out of phase clock signals CLK and CLK_ generated by the oscillator of FIG. 2.

The oscillator is powered by an energy harvesting device such as a thermoelectric generator, receiving a supply voltage (usually a positive supply, VDD), which may be a few tens of millivolts, in this example 80 mV. The differential structure generates out of phase signals CLK and CLK_, as shown in FIG. 3.

Figure 13:
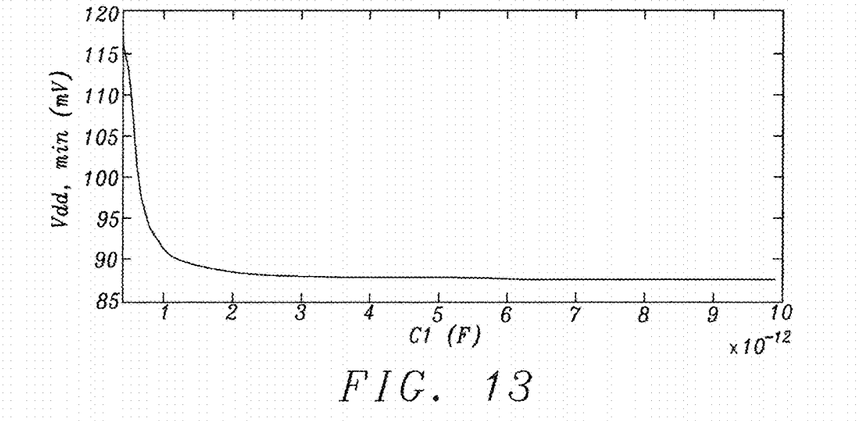
FIG. 13 shows how a minimum supply voltage deceases by augmentation of a degeneration capacitance in an oscillator circuit.

Source degenerations of transistors allow low voltage operation. This is demonstrated by the analytical analysis reported below. In particular FIG. 13 shows how the minimum supply voltage deceases by augmenting the degeneration capacitance C1.

Figure 4:
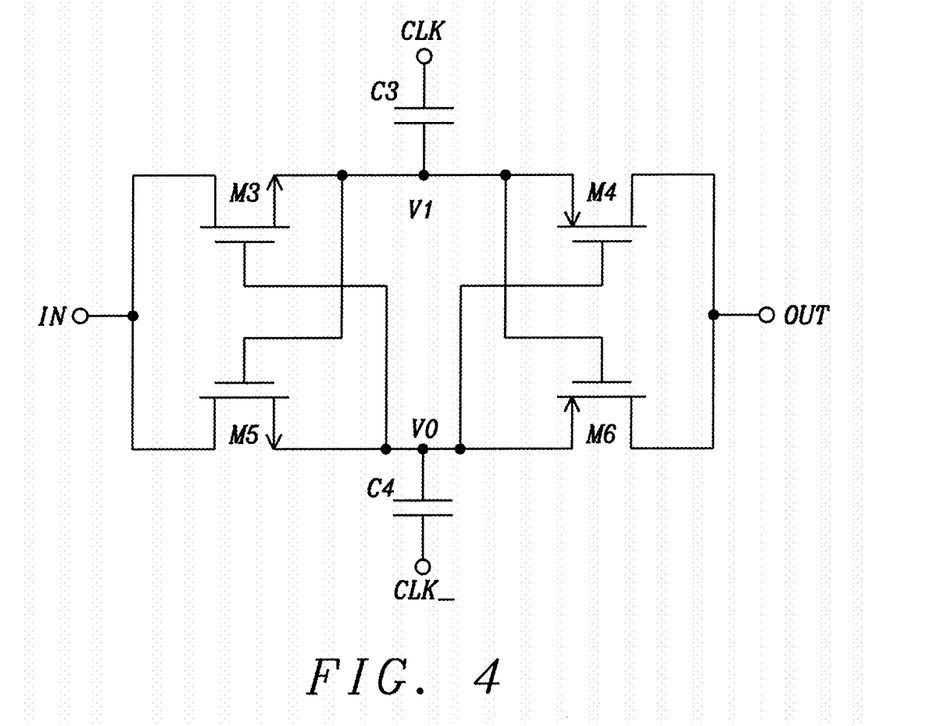
FIG. 4 shows a charge pump stage which may form part of the converter of FIG. 1.

FIG. 4 shows an example charge pump stage which may be used as part of the converter 100. A plurality of these stages may be used, with the output OUT shown in FIG. 4 providing the input IN for another stage. The CLK peak to peak amplitude is about the double of the supply voltage (about 180 mV in this embodiment). The output voltage of the stage is roughly equal to the sum of $V_{PK}$ (peak to peak oscillation amplitude) and $V_{DD}$ (supply voltage).

Figure 5:
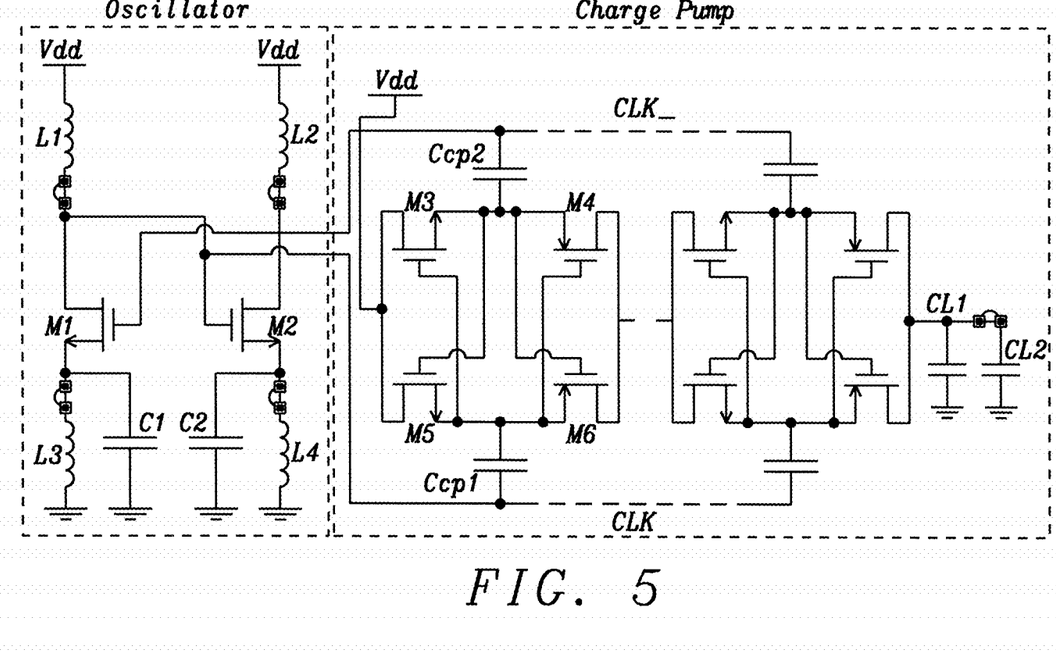
FIG. 5 shows a circuit architecture of a DC-DC converter.

FIG. 5 shows an embodiment of a DC-DC converter comprising a low voltage differential oscillator and a charge pump. Two charge pump stages are illustrated but any number can be provided. The output voltage, VOUT, is given by:

$$V_{OUT}=V_{DD}+N*V_{PK}Ccp1/(Ccp1+CS)-I_{OUT}*R_{OUT}$$

While $$(R_{OUT})=N/(f*(Ccp1+Cs))$$

Ccp1 is the capacitance included in each stage of the charge pump, Cs is the parasitic capacitance between the source of the NMOS and PMOS transistors node and the ground in the charge pump. It includes the parasitic capacitances of the terminals of each charge pump capacitor to the substrate, the parasitic capacitances of interconnection lines and the source to substrates parasitic capacitances of transistors. The parasitic capacitance is about 2.5 pF in this embodiment. N represents the number of charge pump stages.

This layout has been shown to provide the following characteristics:

| $V_{IN}$ (mV) | $f_{CLK}$ (MHz) | $V_{OUT}$ (mV) |
|---|---|---|
| 80 | 0.3 | 515 |
| 100 | 0.3 | 570 |
| 200 | 0.28 | 725 |
| 300 | 0.25 | 850 |
| 400 | 0.22 | 1000 |

With this architecture there is no need to use an external voltage or mechanical switches to generate a start-up voltage.

A body sensor node (BSN) is one example of an energy harvesting device. A BSN can be powered by a combination of energy harvested from multiple sources, for example from human body heat using a micro-Thermo-Electric Generator (μTEG) and energy recovered by a RF harvester.

As the μTEG provides only few tens of mV at its output, it is important to provide an ultra-low power DC-DC converter able to operate at very low voltage.

Figure 6:
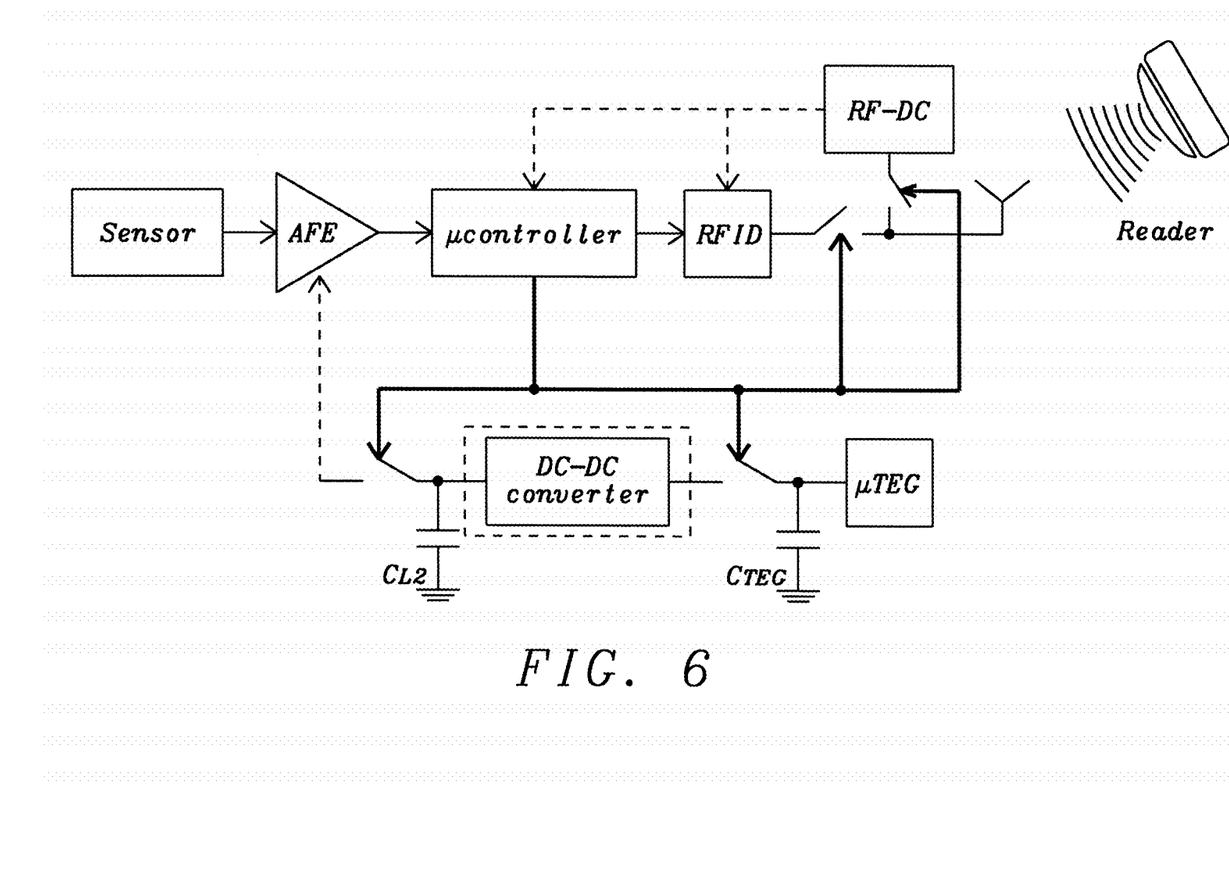
FIG. 6 shows an example system architecture of a body sensor node.

FIG. 6 illustrates an example system architecture of a body sensor node. The RF energy harvester comprises an antenna (which may for example be a 50-Ω dipole-like antenna), and an RF-DC rectifying circuit. Both rectifier and antenna may work at suitable frequency bands, for example, 866.5 MHz in the European UHF RFID band. Other frequencies within this band may be used, or frequencies in other appropriate RF standards and conventions. The antenna harvests and converts into usable energy for its operation the same RF power transmitted by the reader for the sensor interrogation. The rectified DC voltage is used to power up an ultra-low power micro-controller and the RFID chip.

Here, the micro-controller (μcontroller) enables the supply of the sensor interface, samples the output of the analog front end (AFE) of the sensor, and transfers the data to a UHF RFID chip for the transmission. The analog front-end of the sensor includes a set of analog signal conditioning circuitry that uses operational amplifiers, filters providing a configurable and flexible electronics functional block, needed to interface with a variety of sensors. Any type of sensor may be used. To give one non-limiting example, the sensors may be in the healthcare domain providing significant benefits by enabling continuous monitoring, actuation, and logging of patient bio-signal data, which can help medical personnel to diagnose, prevent, and respond to various illnesses such as diabetes, asthma, and heart attacks. Such sensors may comprise (for example) motion sensors, photoplethysmographic sensors, temperature sensors, or acoustic sensors. The AFE is supplied by the energy harvested by a μTEG. The μTEG is intended to be used in environments with low temperature differentials (i.e., the human body in a room temperature setting). It provides an output voltage (stored in the $C_{TEG}$ capacitor), which in a specific embodiment is 430 mV when the temperature gradient is 40° C. However, the surrounding air presents a large thermal resistance that dramatically reduces the effective temperature gradient across the thermopiles composing the µTEG, further limiting the voltage available at the µTEG output. This voltage is only tens of mV, requiring a high conversion ratio DC-DC converter to generate a usable supply voltage. The output of the DC-DC converter is enabled by the micro-controller after an appropriate time in order to ensure that the voltage has reached its maximum value.

FIG. 5 shows a circuit architecture of a DC-DC converter which is suitable for use with the circuit of FIG. 6 but can also be applied in any other context where a very low voltage needs to be stepped up to a useful supply voltage. The converter comprises an oscillator and a charge pump. The charge pump may comprise a plurality of stages. In this embodiment, the converter comprises an ultra-low voltage LC oscillator and a five stage charge pump. The $L_1$, $L_2$, $L_3$, $L_4$ inductors and $C_{L2}$ capacitor may be provided as off-chip components if desired.

As the DC-DC converter input voltage, $V_{dd}$, corresponds to the oscillator supply voltage, a low voltage oscillator providing sufficiently large oscillation should be supplied in order to obtain very low voltage operation. An LC resonant circuit with cross coupled MOS transistors may be used at low voltage. As a circuit with minimum configuration, this oscillator is suitable for low voltage operation with only one MOS transistor between ground and power supply. However, if the supply voltage is lower than a MOS transistor threshold, $V_{TH}$, the oscillation becomes difficult. As a consequence, to reduce the start-up voltage the ultra-low voltage oscillator shown in FIG. 5 can be used. With respect of the LC resonant circuit with cross coupled MOS transistors, the proposed oscillator has a degeneration impedance on the sources of the NMOS transistors that helps in reducing the minimum required supply voltage. This has been demonstrated by the following analytical analysis:

By imposing the start-up condition (i.e. the condition required by the oscillator to start working) the following equation is obtained:

$$\frac{g_m \cdot \omega_0 \cdot L_1 \cdot Q_1}{\left|1 + g_m \cdot \left(\frac{1}{i \cdot \omega_0 \cdot C_1} + i \cdot \omega_0 \cdot L_2\right)\right|} > 1 \quad \text{(Eqn 1)}$$

where $g_m$ is the transconductance of the NMOS transistors, $\omega_0$ is the resonance frequency of the oscillator, and $Q_1$ is the quality factor of the $L_1$ and $L_2$ inductors. At the low voltage supplied to the oscillator by the external device (such as µTEG) the NMOS transistors operate in weak inversion. Therefore, the transconductance of the NMOS transistors is given by:

$$g_m = \frac{I_s \cdot e^{\frac{V_{dd}}{n \cdot V_t}}}{n \cdot V_t} \quad \text{(Eqn 2)}$$

where $I_s$ is the reverse saturation current, n is the slope factor of $M_1$ and $M_2$, $V_t$ is the thermal voltage, and $V_{dd}$ is the supply voltage.

The resonance frequency, $\omega_0$, depends on the resonant load at the drains of $M_1$ and $M_2$. It is given by:

$$\omega_0 = \frac{1}{\sqrt{L_1 \cdot ([5 \cdot (C]_{cp1} + C_{par}))}} \approx \frac{1}{\sqrt{L_1 \cdot 5 \cdot C_{cp1}}} \quad \text{(Eqn 3)}$$

where $C_{par}$ is the parasitic capacitance including the parasitic capacitances of the terminals of each charge pump capacitor to the substrate, the parasitic capacitances of interconnection lines and the pad capacitances. By combining equations (1), (2) and (3), the minimum input voltage, $V_{dd,min}$, is shown to be:

$$V_{dd,min} = \quad \text{(Eqn 4)}$$
$$n \cdot V_t \cdot \ln\left(\frac{1}{I_s \cdot \sqrt{(\omega_0 \cdot L_1 \cdot Q_1)^2 - (\omega_0 \cdot L_2)^2 - \frac{1}{(\omega_0 \cdot C_1)^2} + 2 \cdot \frac{L_2}{C_1}}}\right)$$

FIG. 13 shows that the Vdd,min decreases when a degenerated C1 capacitance is increased, demonstrating the source degeneration impedance helps in reducing the minimum required supply voltage.

Table I reports the values of the circuit components and the values of $I_s$, and n of $M_1$ and $M_2$, which have been obtained by simulations and optimizations.

TABLE I

VALUES OF THE CIRCUITS COMPONENTS AND NMOS PARAMETERS

| Component | value |
|---|---|
| $L_1$ (mH) | 3.3 |
| $C_{cp1}$ (pF) | 24 |
| $Q_1$ | 270 |
| $L_3$ (µH) | 2.2 |
| $C_1$ (pF) | 1 |
| $I_s$ (nA) | 53.4 |
| N | 1.33 |

The circuit is symmetrical, therefore L4=L3, Ccp1=Ccp2, L1=L2 and C1=C2, and the slope factor n is common to all the transistors.

According to equation 4, the resulting minimum voltage at the DC-DC converter input, $V_{dd,min}$, is 91 mV. However, both $I_s$ and n undergo the process spread. Table II reports the values of $I_s$ and n at the process corners and the respective values of $V_{dd,min}$ obtained by equation (4).

TABLE II

VALUES OF $V_{DD,MIN}$ AT THE PROCESS CORNERS

| Process corner | $I_s$ (nA) | n | $V_{dd,min}$ (mV) |
|---|---|---|---|
| typical | 53.4 | 1.33 | 91 |
| fast | 81.3 | 1.23 | 72 |
| slow | 24.5 | 1.41 | 124 |

Both $I_s$ and n have a strong dependency on the temperature. However, the sensor node is supposed to work close to the human body. Therefore, the working temperature is kept around 36° C. with limited variations around this value. As a consequence, the dependency of the start-up voltage on the temperature can be waived.

The peak-to-peak oscillation amplitude, $V_{CLK}$, is the double of the supply voltage, i.e.:

$$V_{CLK} = 2 \cdot V_{dd} \quad \text{(Eqn 5)}$$

The oscillator provides the clock driving the $C_{cp1}$ and $C_{cp2}$ capacitances of each stage of the charge pump.

The output voltage, $V_{out}$, of the charge pump with k stages is given by:

$$V_{out} = V_{dd} \cdot \left( (1-\varepsilon)^{k+1} + 2 \cdot \frac{C_{cp1}}{C_{cp1} + C_{par}} k \cdot \sum_{j=1}^{k} (1-\varepsilon)^{k+1-j} \right) \quad \text{(Eqn 6)}$$

where $\varepsilon$ is the charging error due to the finite resistances of the MOS transistors. The charging error, $\varepsilon$, is calculated as follows:

$$\varepsilon = e^{\frac{T_{CLK}}{4 \cdot \pi \cdot R_{SW} \cdot C_{cp1}}} \approx 1 - \frac{\sqrt{L1 \cdot k}}{2 \cdot R_{SW} \cdot \sqrt{C_{cp1}}} \quad \text{(Eqn 7)}$$

where $R_{SW}$ is the resistance of the MOS transistors and $T_{CLK}$ is the clock period. According to equation 7, in order to reduce the charging error $\varepsilon$, $R_{SW}$ and $C_{cp1}$ should be designed as small as possible, while $L_1$ and k should be designed as large as possible. However $R_{SW}$ is limited by the reduce supplied voltage, $C_{p1}$ has a lower limit due to the parasitic capacitances $C_{par}$, while augmenting the number of stages k increases the power consumption. Therefore, it may be chosen to have a very large $L_1$ and $L_2$ inductors by using off-chip components.

The number of stages k has been calculated in order to reach a 500 mV output voltage starting from the minimum input voltage required by the oscillator (91 mV). Therefore a conversion ratio higher than 5 is required. By adopting a 5 stages charge pump an ideal gain of 11 can be reached. However, due to the losses caused by the parasitic capacitances and the charging error, a effective convertion ratio slightly higher than 5 is obtained by simulations.

Figure 7:
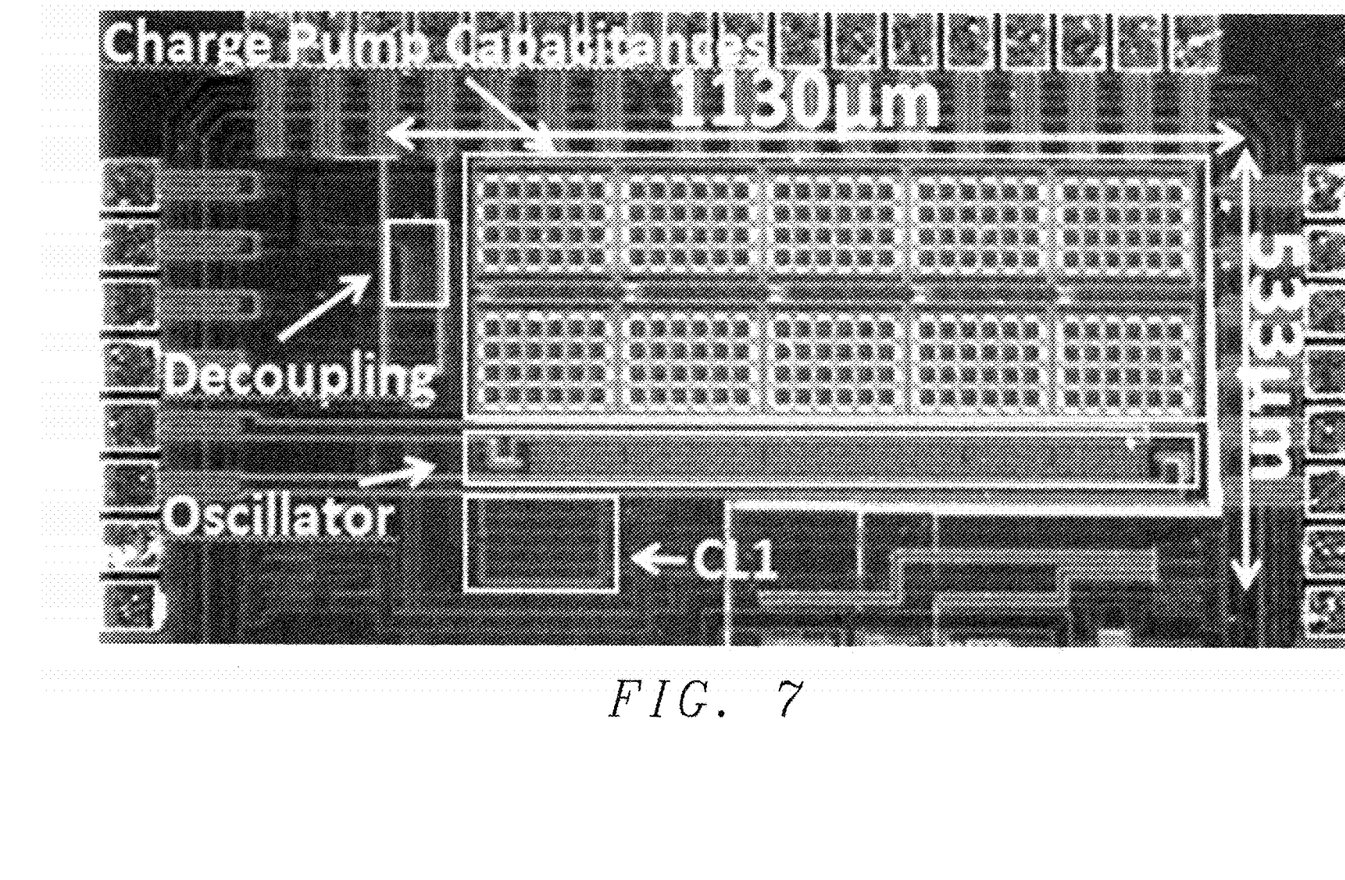
FIG. 7 shows a die photograph of a DC-DC converter according to an embodiment of the disclosure.

An embodiment of the DC-DC converter has been designed in a 0.18 μm CMOS technology. FIG. 7 shows the die photograph. Chip sizes are 1130 μm×533 μm. The output capacitance comprises the parallel of the integrated capacitance $C_{L1}$ of 100 pF (implemented by an NMOS cap), and an off chip capacitance $C_{L2}$ of 1 μF.

Figure 8:
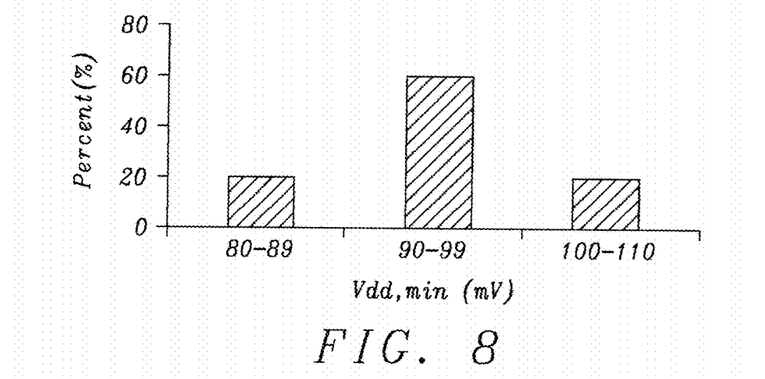
FIG. 8 shows the percentage distribution of chip samples used for testing versus a minimum input voltage.

Ten chip samples were available for measurements. FIG. 8 shows the percentage distribution of the chip samples versus the minimum input voltage. The 60% of the available samples have a minimum input voltage in the 90 mV-99 mV range, while the mean value is 96 mV. This value is close to the calculated one. Measurements here reported are relative to the sample with a minimum input voltage equal to 96 mV as the mean one.

Figure 9:
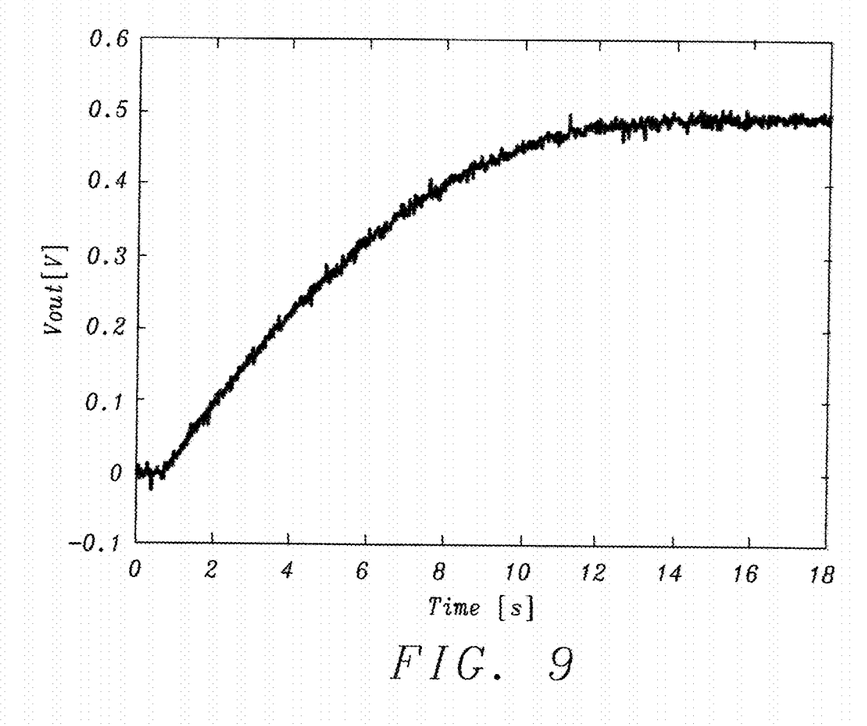
FIG. 9 shows a transient of output voltage of the DC-DC converter of FIG. 3 at 96 mV input voltage.

FIG. 9 shows the transient of the output voltage. After about 15 s transient the output voltage reaches 500 mV at the steady state. This transient time decreases at the increasing of the input voltages. For input voltages larger than 200 mV, it is in the range of few milliseconds.

Figure 10:
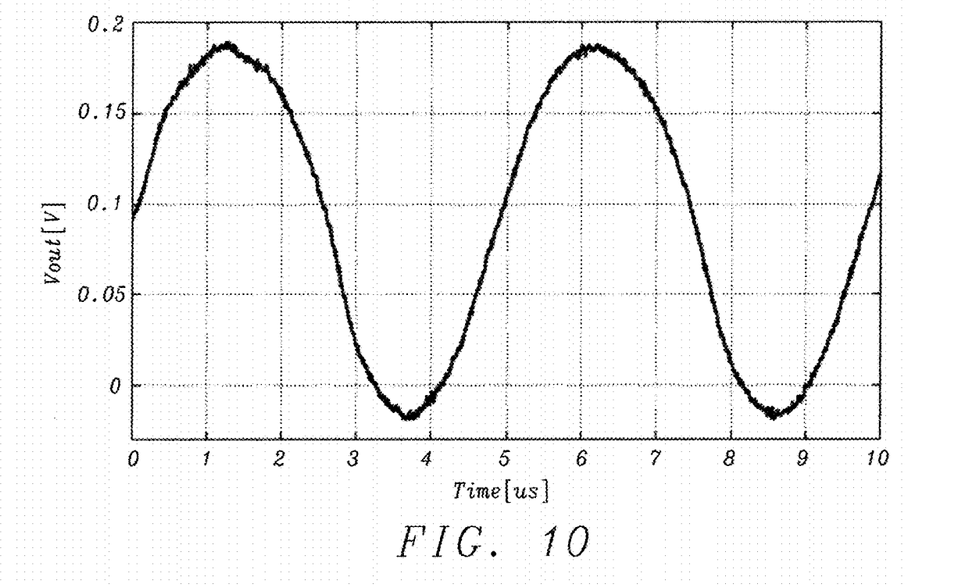
FIG. 10 illustrates a clock voltage from generated by an oscillator of the converter of FIG. 7.

FIG. 10 shows the clock voltage. The peak-to-peak clock amplitude is 195 $mV_{pp}$, which is close to the double of the input voltage, as calculated by equation 5.

Figure 11:
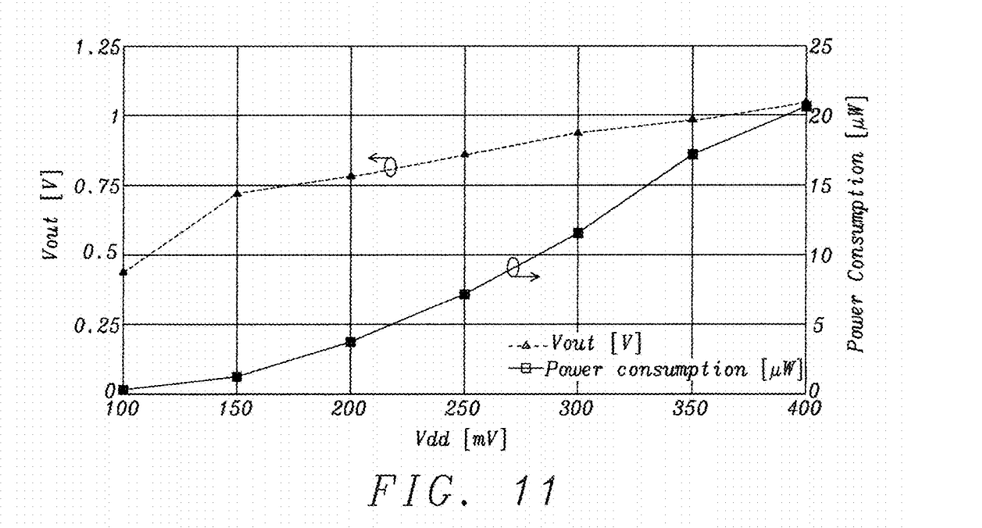
FIG. 11 shows converter output voltage and the power consumption versus the input voltage.

FIG. 11 shows the output voltage (upper graph) and the power consumption (lower graph) versus the input voltage. At the increasing of input voltage, the MOS transistors of charge pump pass from sub-threshold to linear operating region, therefore the power consumption increases considerably (from 1 μW at 96 mV $V_{dd}$, up to 50 μW at 400 mV $V_{dd}$).

Figure 12:
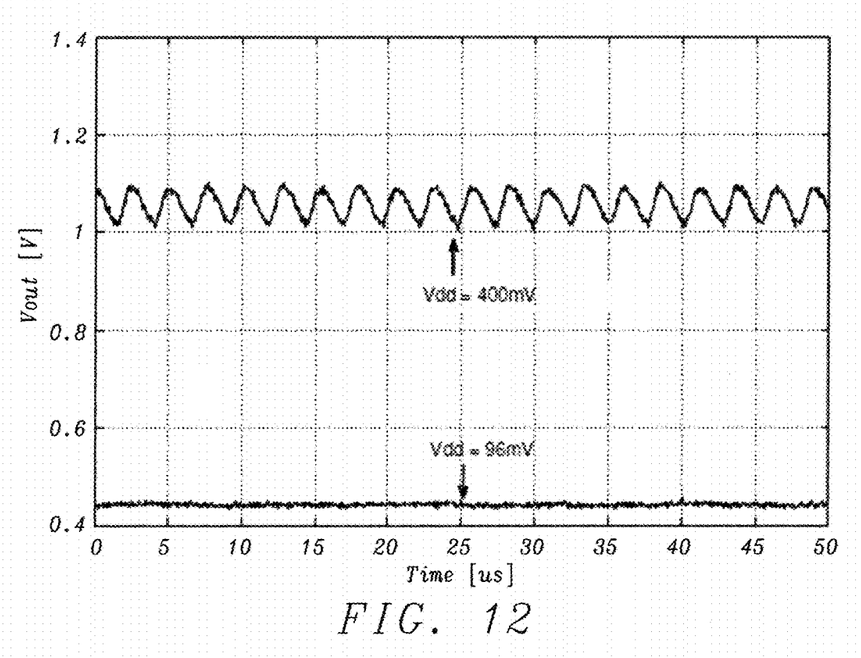
FIG. 12 shows an output voltage in steady state condition at the edge of the input voltage range.

FIG. 12 shows the output voltage in steady state condition at the edges of the input voltage range (96 mV, and 400 mV). At 96 mV $V_{dd}$, the output voltage is equal to 500 mV with a 10 $mV_{pp}$ ripple. At 400 mV $V_{dd}$, the output voltage is 1.1V, while the ripple reaches its maximum value of 70 $mV_{pp}$.

Output ripple can be reduced by increasing the off chip output capacitance $C_{L2}$, at the cost of a slower transient of the output voltage to reach the steady state value.

The DC-DC converter of the present disclosure has better minimum input voltage and power consumption than existing solutions, and furthermore does not need mechanical switching or pre-charged external batteries to start-up the oscillator.

An ultra-low power DC-DC converter has been disclosed. One example use case is the embedding into body sensor nodes. The converter may be used to step-up the voltage at the output of a μTEG. The specific example disclosed herein features a 96 mV minimum input voltage while consuming 1 μW. The output voltage ranges between 0.5V and 1.1V. These results compare favourably as compared with existing solutions in terms of minimum input voltage and power consumption.

Various improvements and modifications can be made to the above without departing from the scope of the disclosure.

What is claimed is:

1. A DC-DC converter comprising an oscillator with a charge pump wherein the oscillator comprises one or more source degenerated transistors, wherein each transistor comprises a degeneration impedance located between a source of the transistor and a ground connection, wherein the degeneration impedance comprises an inductor and a capacitor.

2. The DC-DC converter of claim 1, being a boost converter.

3. The DC-DC converter of claim 1, wherein the oscillator is a low voltage oscillator.

4. The DC-DC converter of claim 1, wherein the oscillator is a differential oscillator.

5. The DC-DC converter of claim 1, wherein the charge pump comprises a plurality of charge pump stages.

6. An energy harvesting device comprising a DC-DC converter that includes an oscillator with a charge pump wherein the oscillator comprises one or more source degenerated transistors, wherein each transistor comprises a degeneration impedance located between a source of the transistor and a ground connection, wherein the degeneration impedance comprises an inductor and a capacitor.

7. The energy harvesting device of claim 6, wherein the DC-DC converter is a boost converter.

8. The energy harvesting device of claim 6, wherein the oscillator is a low voltage oscillator.

9. The energy harvesting device of claim 6, wherein the oscillator is a differential oscillator.

10. The energy harvesting device of claim 6, wherein the charge pump comprises a plurality of charge pump stages.

11. A method of DC-DC conversion comprising the step of:
    providing an oscillator with a charge pump wherein the oscillator comprises one or more source degenerated transistors, wherein each transistor comprises a degeneration impedance located between a source of the transistor and a ground connection, wherein the degeneration impedance comprises an inductor and a capacitor.

12. The method of claim 11, being a boost conversion.

13. The method of claim 11, wherein the oscillator is a low voltage oscillator.

14. The method of claim 11, wherein the oscillator is a differential oscillator.

15. The method of claim 11, wherein the charge pump comprises a plurality of charge pump stages.

16. A method of harvesting energy comprising the step of:
providing a DC-DC converter that includes an oscillator with a charge pump wherein the oscillator comprises one or more source degenerated transistors, wherein each transistor comprises a degeneration impedance located between a source of the transistor and a ground connection, wherein the degeneration impedance comprises an inductor and a capacitor.

17. The method claim 16, wherein the DC-DC converter is a boost converter.

18. The method of claim 16, wherein the oscillator is a low voltage oscillator.

19. The method of claim 16, wherein the oscillator is a differential oscillator.

20. The method of claim 16, wherein the charge pump comprises a plurality of charge pump stages.

\* \* \* \* \*

UNITED STATES PATENT AND TRADEMARK OFFICE
CERTIFICATE OF CORRECTION

PATENT NO. : 10,044,259 B2
APPLICATION NO. : 15/357033
DATED : August 7, 2018
INVENTOR(S) : Stefano D'Amico, Francesco Dalena and Mirko Pasca Page 1 of 1

It is certified that error appears in the above-identified patent and that said Letters Patent is hereby corrected as shown below:

On the Title Page

Item [72], delete "Leghom (IT)" and replace with -- Livorno, (IT) --.

Signed and Sealed this
Twenty-second Day of January, 2019

Andrei Iancu
*Director of the United States Patent and Trademark Office*